United States Patent [19]

Park et al.

[11] Patent Number: 5,780,911
[45] Date of Patent: Jul. 14, 1998

[54] THIN FILM TRANSISTOR AND METHOD FOR FABRICATING THE SAME

[75] Inventors: Joon Young Park, Chungcheongbuk-do; Gyoung Seon Gil, Jenrabuk-do; Seok Won Cho, Chungcheongbuk-do, all of Rep. of Korea

[73] Assignee: LG Semicon Co., Ltd., Cheongju, Rep. of Korea

[21] Appl. No.: 756,451

[22] Filed: Nov. 26, 1996

[30] Foreign Application Priority Data

Nov. 29, 1995 [KR] Rep. of Korea ............... 44972/1995
Nov. 29, 1995 [KR] Rep. of Korea ............... 44973/1995

[51] Int. Cl.$^6$ .................... H01L 29/76; H01L 29/94; H01L 31/062; H01L 31/113
[52] U.S. Cl. .................... 257/401; 257/60
[58] Field of Search .................... 257/60, 401

[56] References Cited

U.S. PATENT DOCUMENTS 5,563,077  10/1996  Ha .
5,578,838  11/1996  Cho et al. .

FOREIGN PATENT DOCUMENTS 5343679  12/1993  Japan .

Primary Examiner—Stephen Meier
Attorney, Agent, or Firm—Fleshner & Kim

[57] ABSTRACT

A thin film transistor that can have a greater on/off current ratio is disclosed. The thin film transistor includes a substrate, a first gate electrode section formed on a predetermined region of the substrate, a second gate electrode section formed on a predetermined portion of the first gate electrode section, a third gate electrode section formed on the second gate electrode section parallel to, and spaced from the first gate electrode section. A gate electrode is formed by the first, second and third gate electrode sections. A gate insulating film is formed on exposed surfaces of the first, second and third gate electrode sections and a semiconductor layer is formed on the gate insulating film and the substrate. A first impurity region is formed in the semiconductor layer on one side of the first gate electrode section and a second impurity region is formed in the semiconductor layer on the second and third gate electrode sections on the other side of the first gate electrode section.

17 Claims, 7 Drawing Sheets

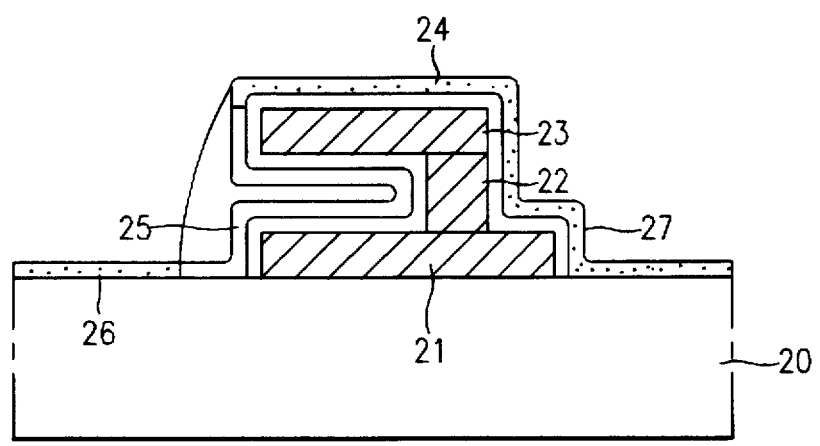
F I G.2

F I G.3a
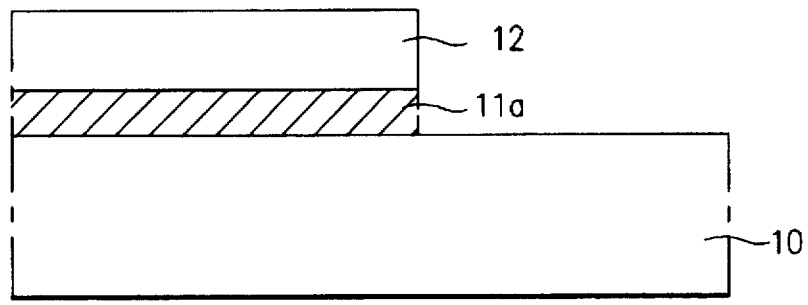
F I G.3b
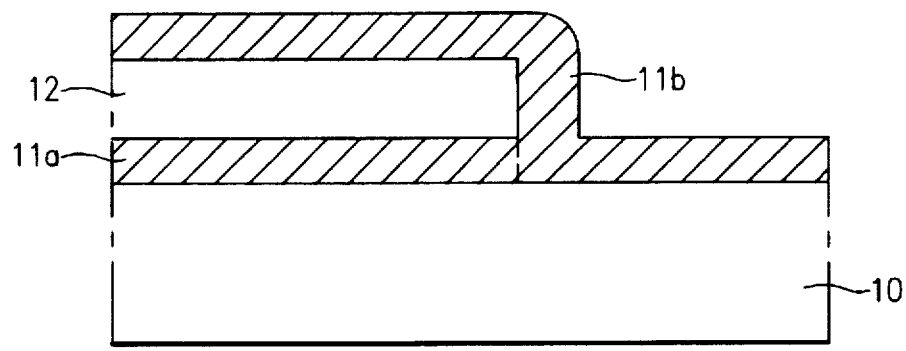
F I G.3c
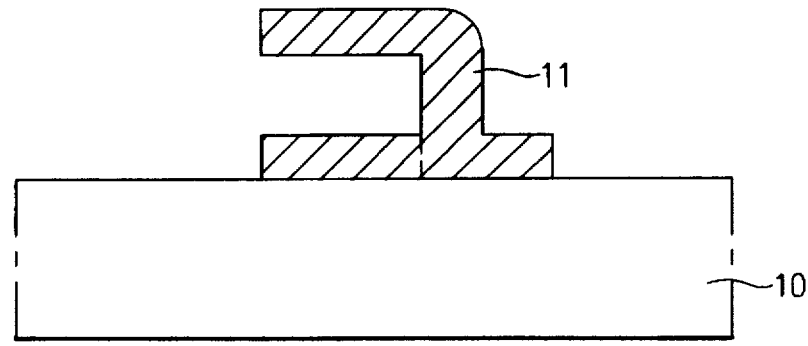

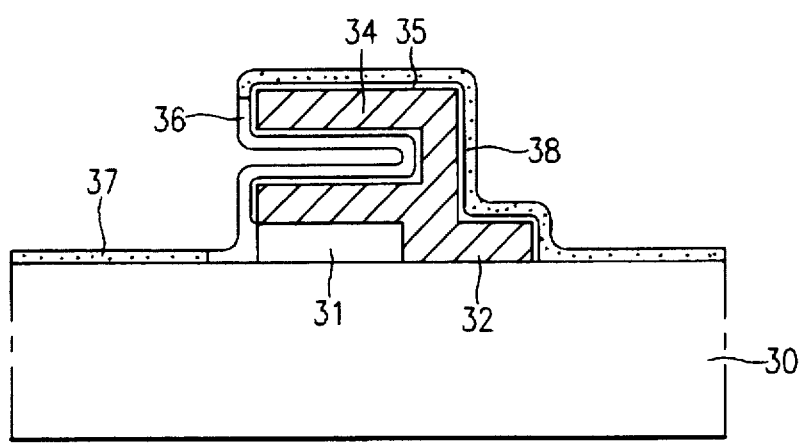
F I G.4

F I G.5a
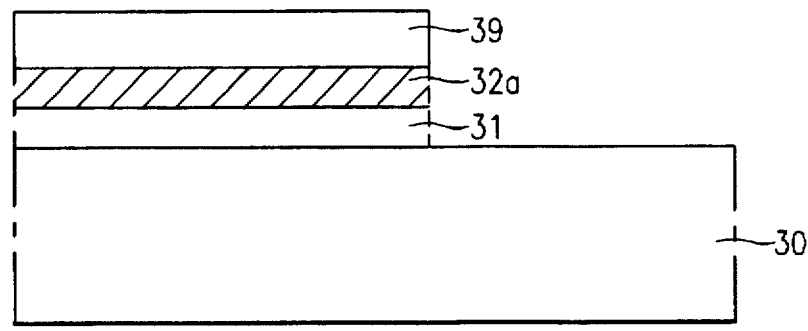
F I G.5b
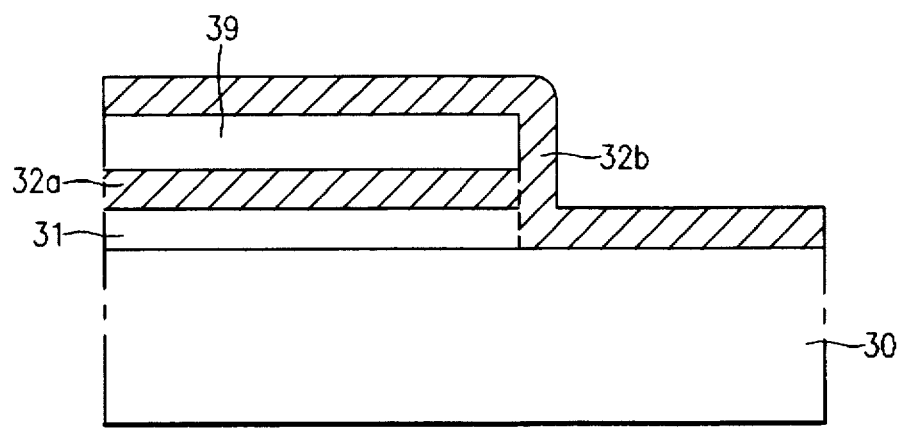
F I G.5c
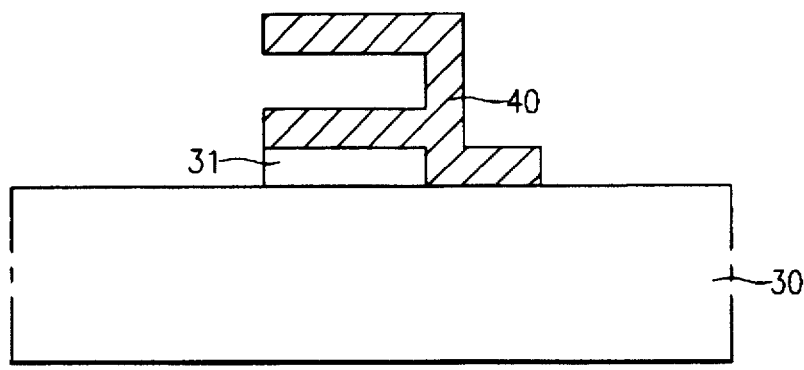

F I G.5d
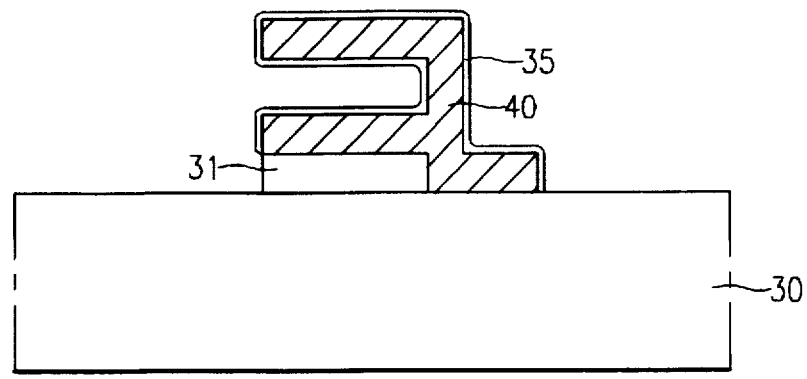
F I G.5e
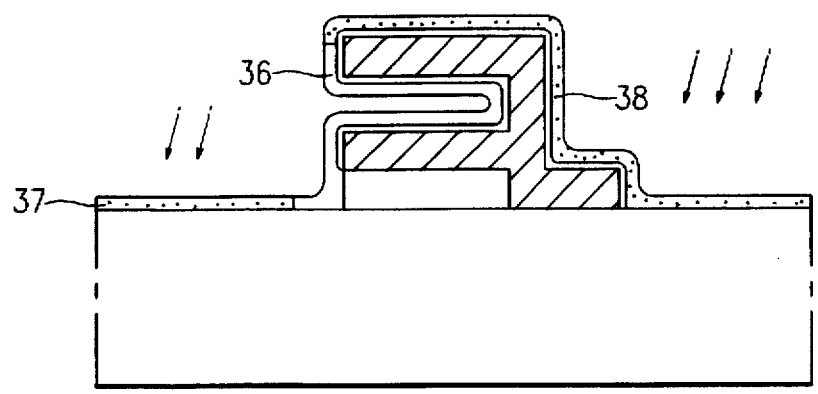
F I G.5f
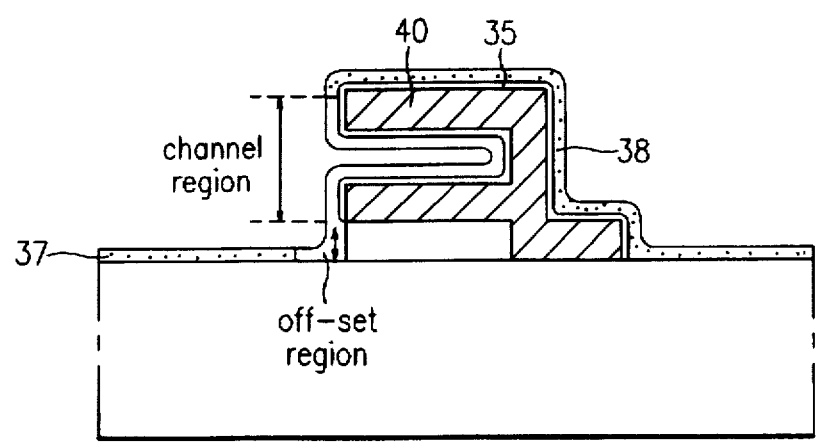

THIN FILM TRANSISTOR AND METHOD FOR FABRICATING THE SAME

BACKGROUND OF THE INVENTION

1. Field of the Invention

The present invention relates to a thin film transistor and, more particularly, to a thin film transistor which can have a greater on/off current ratio; and a method for fabricating the same.

2. Discussion of the Related Art

In general, the thin film transistor is widely used, either in an SRAM device of 1M class an over in place of a load resistor, or in an liquid crystal display as a switching device for switching a video data signal from pixel regions. Especially, in the SRAM device of 4M class and over which requires a high quality thin film transistor as its device packing density becomes higher, the thin film transistor should have a less off current and a greater on current for reducing power consumption and improving memory characteristic of the SRAM device.

A conventional method for fabricating the thin film transistor which can improve the on/off current ratio will be explained FIGS. 1a~1d illustrate sections showing the process steps of a conventional method for fabricating a PMOS thin film transistor.

In the conventional method for fabricating a PMOS thin film transistor, a solid state growth of body polysilicon is conducted based on a bottom gate to make a grain size bigger. The solid state growth is conducted at a temperature around 600° C. for a long time around 24 hours in a heat treatment.

Referring to FIG. 1a, a polysilicon layer is deposited on an insulating substrate 1 or an insulating film, and subjected to photolithography patterning to form a gate electrode 2 using a gate mask.

Referring to FIG. 1b, a gate insulating film 3 and a body polysilicon layer 4 are chemical vapor deposited in succession on the entire Ace of the insulating substrate I including the gate electrode 2. Then the grain size of the body polysilicon 4 is grown greater to make its off current less by a solid state growth in which the body polysilicon layer 4 is subjected to heat treatment at a temperature around 600° C. for a long time around 24 hours, and ions are injected into the body polysilicon layer 4 to adjust a threshold voltage.

Raring to FIG. 1c, a photoresist film 5 is deposited on the body polysilicon layer 4, and subjected to exposure and development to define a channel region. In this instant, the channel region is mask so that a source region is overlapped with the gate electrode 2 and a drain region is off-set from the gate electrode 2. P type impurity ions, such as $BF_2$, are injected into the body polysilicon layer 4 at an exposed portion thereof using the photoresist film 5 as a mask Referring to FIG. 1d, the impurities are diffused to form a source region 6 and a drain region 7, and the photoresist film 5 is removed.

However, the conventional method for fabricating a thin film transistor has the following problems.

First, the definition of the channel region on the same time with the definition of the source region being overlapped with the gate electrode and the drain region being off-set from the gate electrode by photolithography using the photoresist film is difficult in reproduction, causing a great variation of the off current depending on alignment, that degrades the reliability.

Second, since the arrangement of the channel in the thin film transistor is planar, when the cell size is reduced, the channel length is also reduced to cause a greater leakage current, and, on the contrary, the cell size should be greater for reducing the leakage current, there is difficulty in high density packing of the devices.

SUMMARY OF THE INVENTION

Accordingly, the present invention is directed to a thin film transistor and a method for fabricating the same that substantially obviates one or more of the problems due to limitations and disadvantages of the related art.

Additional features and advantages of the invention will be set forth in the description which follows, and in part will be apparent from the description, or may be learned by practice of the invention The objectives and other advantages of the invention will be realized and attained by the structure particularly pointed out in the written description and claims hereof as well as the appended drawings.

To achieve these and other advantages and in accordance with the purpose of the present invention, as embodied and broadly described, the thin film transistor includes a substrate, a first gate electrode formed on a predetermined region of the substrate, a second gate electrode formed on a predetermined portion of the first gate electrode, a third gate electrode formed on the second gate electrode in parallel to, and spaced from the first gate electrode, a gate insulating film formed on exposed surfaces of the first, second and third gate electrodes, a semiconductor layer formed on the sate insulating film and the substrate, a first impurity region formed in the semiconductor layer on one side of the first gate electrode, and a second impurity region formed in the semiconductor layer on the second, and third gate electrodes and on the other side of the first gate electrode.

In other aspect of the present invention, there is provided a method for fabricating a thin film transistor including the steps of (1) forming a first conductive layer and an insulating film in succession on a predetermined region of a substrate, (2) forming a second conductive layer on the insulating film and the substrate on one side of the insulating film, the second conductive layer being formed to be connected with the first conductive layer, (3) removing the insulating film, (4) forming a gate insulating film on exposed surfaces of the first, and second conductive layers, (5) forming a semiconductor layer on the entire surface of the substrate including the gate insulating film, (6) forming insulating film sidewalls at sides of the semiconductor layer and (7) forming a first impurity region and a second impurity region in the semiconductor layer using the insulating film sidewalls as masks.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings:

In the drawings:

FIG. 2 illustrates a section showing a thin film transistor in accordance with a first embodiment of the present invention;

FIGS. 3a–3f illustrate sections showing the process steps of a method for fabricating a thin film transistor in accordance with a first embodiment of the present invention;

FIG. 4 illustrates a section showing a thin film transistor in accordance with a second embodiment of the present invention; and, FIGS. 5a–5f illustrate sections showing the process steps of a method for fabricating a thin film transistor in accordance with a second embodiment of the present invention.

DETAILED DESCRIPTION OF THE PREFERRED EMBODIMENTS

Figure 1A:
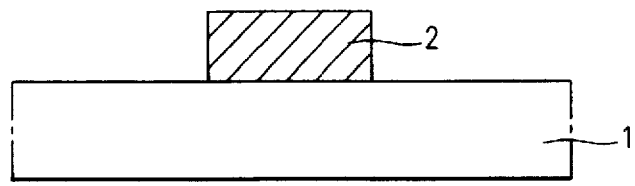
FIGS. 1a~1d illustrate sections showing the process steps of a conventional method for fabricating a thin film transistor.
Figure 1B:
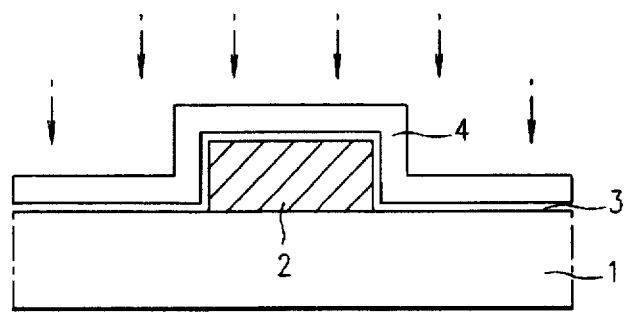
Figure 1C:
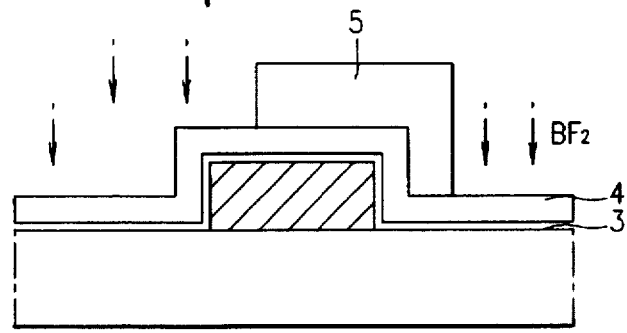
Figure 1D:
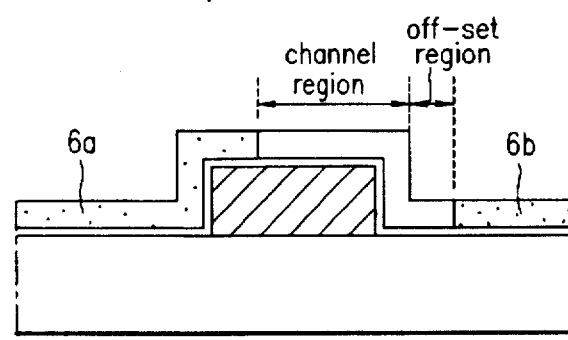

Reference will now be made in detail to the preferred embodiments of the present invention, examples of which are illustrated in the accompanying drawings.

FIG. 2 illustrates a section showing a thin film transistor in accordance with a first embodiment of the present invention, and FIGS. 3a–3f illustrate sections showing the process steps of a method for fabricating the thin film transistor in accordance with the first embodiment of the present invention.

The thin film transistor in accordance with a first embodiment of the present invention includes a first gate electrode section 21 formed on a predetermined region of an insulating substrate 20, a second gate electrode section 22 formed on, and electrically connected to a predetermined portion of the first gate electrode section 21 and a third gate electrode 23 formed on the second electrode section 22 in parallel with, and spaced from the first gate electrode section 21. A gate electrode is formed by the first, second and third gate electrode sections 21, 22 and 23. In this instant, the third gate electrode section 23 (hereafter third gate electrode 23) is formed electrically connected with the second gate electrode section 22 (hereafter second gate electrode 22) and aligned with the first gate electrode section 21 (hereafter first gate electrode 21) in one side. The thin film transistor further includes an insulating film 24 formed on exposed surfaces of the first, second and third gate electrodes 21, 22 and 23, a semiconductor layer 25 formed on the gate insulating film 24 and the insulating substrate 20, a first impurity region 26 formed in the semiconductor layer 25 on one side of, and off-set from the gate electrode 21, and a second impurity region 27 formed in the semiconductor layer on the second gate electrode 22 and the third gate electrode 23 and the other side of the first gate electrode 21.

A method for fabricating the thin film transistor in accordance with the first embodiment of the present invention will be explained.

Referring to FIG. 3a, a first conductive layer 11a and a first insulating film 12 are formed on an insulating substrate 10 in succession, and subjected to photolithography and etching to remove the first conductive layer 11a and the first insulating film 12 selectively, to form the first gate electrode. The first conductive layer is formed of polysilicon and the first insulating film is formed of a nitride.

Referring to FIG. 3b, a second conductive layer 11b is formed on the entire surface of the substrate. The second conductive layer 11b is formed of the same material with the first conductive layer 11a, and the first and second conductive layers are formed connected to the other.

Referring to FIG. 3c, the second conductive layer 11b, the first insulating film 12 and the first conductive layer 11a are removed selectively to form a gate electrode 11 such that a portion connecting the first conductive layer 11a and the second conductive layer 11b is placed at the center of the gate electrode 11 by photolithography and etching. And, the first insulating film 12 is removed by wet etching using phosphoric acid($H_3PO_4$) solution.

Figure 3D:
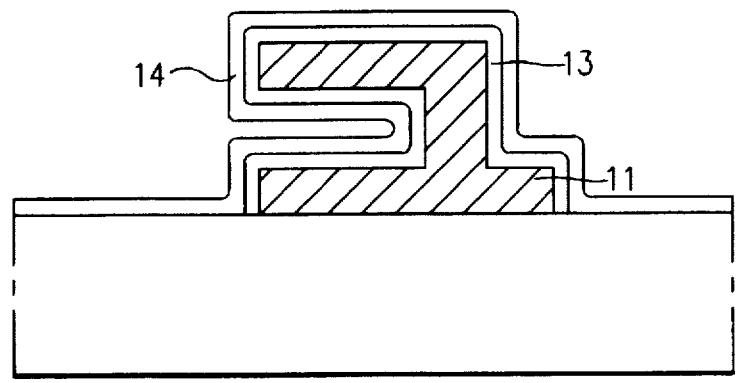

Referring to FIG. 3d, a surface of the gate electrode 11 is oxidized to form a second insulating film 13 on the gate electrode. And, a semiconductor layer 14 is formed on the entire surface of the substrate 10 and the second insulating film 13, and the semiconductor layer 14 is annealed to grow its grain size to lower the off current. In this instant, the semiconductor layer 14 is formed of a doped polysilicon for adjusting a threshold voltage of the thin film transistor.

Figure 3E:
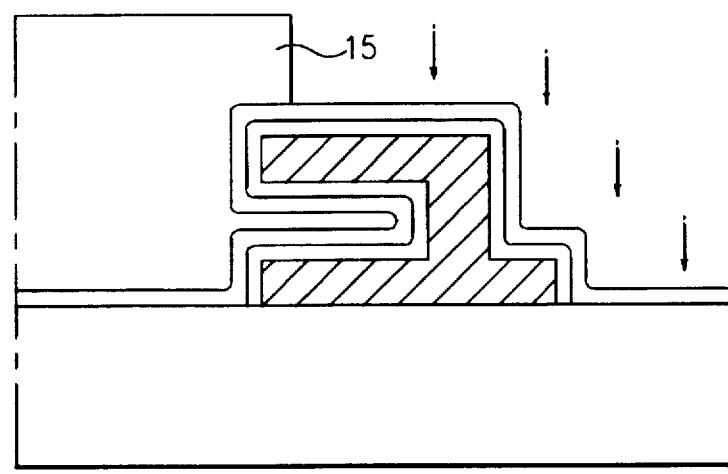

Referring to FIG. 3e, a photoresist film 15 is deposited on the entire surface of the substrate, subjected to exposure and development to expose only the semiconductor layer to be used as a source region selectively, and subjected to ion injection to reduce a resistance in the source region, and then the photoresist film 15 is removed.

Figure 3F:
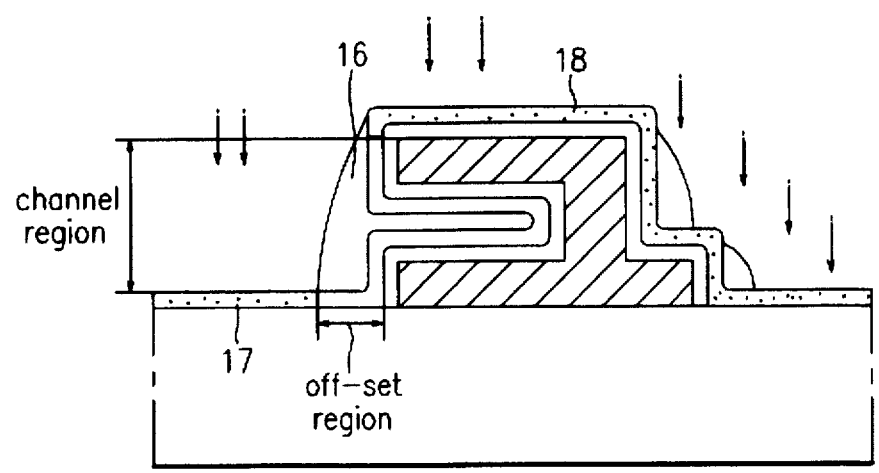

Referring to FIG. 3f, an oxide film is formed on the entire surface and etched back to form sidewalls 16 at sides of the semiconductor layer 14, and impurity ions, such as $BF_2$, are injected to form first, and second impurity regions 17 and 18 to be used as source drain. In this instant, since the sidewall 16 formed at the portion of the semiconductor layer 14 having a recess is formed wider due to greater step coverage, causing the impurity ions not injected into the semiconductor layer 14 under the sidewall 16, the gate electrode 11 and the first impurity region 17 are formed off-set.

FIG. 4 illustrates a section showing a thin film transistor in accordance with a second embodiment of the present invention, and FIGS. 5a–5f illustrate sections showing the process steps of a method for fabricating a thin film transistor in accordance with a second embodiment of the present invention.

Referring to FIG. 4, the thin film transistor in accordance with a second embodiment of the present invention includes an insulating film 31 formed on a predetermined region of an insulating substrate 30 for defining an off-set region, a first gate electrode 32 formed on the insulating film 31 and on the substrate 30 on one side of the insulating film 31, a second gate electrode 33 formed on the first gate electrode 32 over an one side edge of the insulating film 31, a third gate electrode 34 formed on the second gate electrode 33 over the insulating film 31 in parallel with, and spaced from the first gate electrode 32, a gate insulating film 35 formed on exposed surfaces of thus formed first, second and third gate electrodes 32, 33 and 34, a semiconductor layer 36 formed on the gate insulating film 35 and the insulating substrate 30, a first impurity region 37 formed in the semiconductor layer 36 on the insulating substrate 30 on the other side of the insulating film 31, a second impurity region 38 formed on the third gate electrode 34 and the second gate electrode 33 and on the insulating substrate 30 on one side of the insulating film 31 and the first gate electrode 32. Accordingly, the first impurity region 37 is formed off-set from the first gate electrode 32 as much as a thickness of the insulating film 31.

The method for fabricating the thin film transistor in accordance with the second embodiment of the present invention having the aforementioned configuration will be explained.

Referring to FIG. 5a, a first insulating film 31, a first conductive layer 32a and a second insulating film 39 are formed on an insulating substrate 30 in succession, and subjected to photolithography to leave the first insulating film 31, the first conductive layer 32a and the second insulating film 39 selectively on a predetermined portion of the insulating substrate 30. The first insulating film 31 is formed of an oxide to a thickness of 2000~3000 Å, the first conductive layer 32a is formed of polysilicon and the second insulating film 39 is formed of a nitride.

Referring to FIG. 5b, a second conductive layer 32b is formed on the entire surface of a resultant of the aforementioned process. The second conductive layer 32b is formed of the same material with the first conductive layer 32a, and the first conductive layer 32a is formed so that one side of the first conductive layer 32a is connected to the second conductive layer 32b.

Referring to FIG. 5c, the first insulating film 30, the second conductive layer 32b, the second insulate film 39 and the first conductive layer 32a are removed selectively to form a gate electrode 40 such that a portion connecting the first conductive layer 32a and the second conductive layer 32b is placed at the center of the gate electrode 40. And, all the second insulating film 39 is removed by wet etching using phosphoric acid ($H_3PO_4$) solution.

Referring to FIG. 5d, a surface of the gate electrode 40 is oxidized to form a gate insulating film 35 on the exposed surface of the gate electrode 40.

Referring to FIG. 5e, a semiconductor layer 36 is formed on the entire surface of the substrate 30 and the gate insulating film 35, and the semiconductor layer 36 is annealed to grow its grain size to lower the off current. In this instant, the semiconductor layer 36 is formed of a doped polysilicon for adjusting a threshold voltage of the thin film transistor. Impurity ions are injected into the semiconductor layer 36 at a tilted position to form first, and second impurity regions 37 and 38. Accordingly, as shown in FIG. 3f, a portion of the semiconductor layer 36 between the fist and second impurity regions 37 and 38 becomes a channel region, and the gate electrode 40 and the first impurity region 37 are formed off-set.

The thin film transistor and method for fabricating the thin film transistor of the present invention having explained have the following advantages.

First, since the channel region is defined in self-alignment without use of photolithography and the off-set region is defined by adjusting a thickness of the insulating film, the thin film transistor and method for fabricating the thin film transistor of the present invention have a good reproducibility and a higher reliability because variation of the off current is less.

Second, the three dimensional arrangement of the channel in the thin film transistor allows to maintain a length of the channel even if a cell size is reduced, whereby an erroneous operation of the transistor coming from a leakage current can be prevented, and the allowance for size reduction with a possible improvement in extent of device packing density facilitates application to an SRAM device of 64M class and over.

It will be apparent to those skilled in the art that various modifications and variations can be made in a thin film transistor and a method for fabricating the thin film transistor of the present invention without departing from the spirit or scope of the invention. Thus, it is intended that the present invention cover the modifications and variations of this invention provided they come within the scope of the appended claims and their equivalents.

What is claimed is:

1. A thin film transistor comprising:
   a substrate;
   a first section of a gate electrode formed on a predetermined region of the substrate;
   a second section of the gate electrode formed on a predetermined portion of the first section of the gate electrode;
   a third section of the gate electrode formed on the second section of the gate electrode parallel to, and spaced from the first section of the gate electrode, wherein the first and third sections are parallel to the substrate;
   a gate insulating film formed on exposed surfaces of the first, second and third sections;
   a semiconductor layer formed on the gate insulating film and the substrate;
   a first impurity region formed in the semiconductor layer on one side of the first section; and
   a second impurity region formed in the semiconductor layer on the second and third sections and on the other side of the first section.

2. A thin transistor as claimed in claim 1, wherein the third section is aligned with the first section of the gate electrode at one side.

3. A thin film transistor as claimed in claim 1, wherein the first section is off-set from the first impurity region.

4. A thin film transistor as claimed in claim 1, wherein the gate insulating film is formed by thermal oxidation.

5. A thin transistor as claimed in claim 1, wherein the semiconductor layer is formed of a doped polysilicon.

6. A thin film transistor as claimed in claim 1, wherein the first, second and third sections of the gate electrode are integrally formed.

7. A thin film transistor as claimed in claim 1, wherein a channel is formed in the semiconductor layer between the first and second impurity regions.

8. A thin film transistor as claimed in claim 1, wherein the second impurity region overlaps the second and third sections of the gate electrode.

9. A thin film transistor as claimed in claim 1, wherein the first impurity region and part of the second impurity region are parallel to a surface of the substrate.

10. A thin film transistor as claimed in claim 1, wherein the first impurity region is next to the first section of the gate electrode.

11. A thin film transistor comprising:
    a substrate;
    an insulating film formed on a predetermined region of the substrate;
    a first gate electrode section formed on the insulating film and the substrate on one side of the insulating film;
    a second gate electrode section formed on a predetermined portion of the first gate electrode section;
    a third gate electrode section formed on the second gate electrode section parallel to, and spaced from the first gate electrode section, wherein the first and third gate electrode sections are parallel to the substrate;
    a gate insulating film formed on exposed surfaces of the first, second and third gate electrode sections;
    a semiconductor layer formed on the gate insulating film and the substrate;
    a first impurity region formed in the semiconductor layer on the substrate on the other side of the insulating film; and
    a second impurity region formed in the semiconductor layer on the second and third gate electrode sections and on the substrate on one side of the insulating film.

12. A thin film transistor as claimed in claim 11, wherein the first impurity region is formed off-set form the first gate electrode section by a thickness of insulating film.

13. A thin film transistor as claimed in claim 11, wherein the first, second and third gate electrode sections comprise a gate electrode.

14. A thin film transistor as claimed in claim 11, wherein the first impurity region and part of the second impurity region are parallel to a surface of the substrate.

15. A thin film transistor as claimed in claim 11, wherein the first impurity region is next to the insulating film.

16. A thin film transistor as claimed in claim 11, wherein a channel is formed in the semiconductor layer between the first and second impurity regions.

17. A thin film transistor comprising:

a substrate;

a first gate electrode section formed on a predetermined region of the substrate;

a second gate electrode section formed on a predetermined portion of the first gate electrode section;

a third gate electrode section formed on the second gate electrode section in parallel to, and spaced from the first gate electrode section;

a gate insulating film formed on exposed surfaces of the first, second and third gate electrodes;

a semiconductor layer formed on the gate insulating film and the substrate, wherein the semiconductor layer includes first, second and third sections between the first and third gate electrode sections, and wherein the first and third sections of the semiconductor layer are parallel to the substrate;

a first impurity region formed in the semiconductor layer on one side of the gate electrode section; and a second impurity region formed in the semiconductor layer on the second and third gate electrode sections and on the other side of the first gate electrode section.

* * * * *